(12) United States Patent
Shia et al.

(10) Patent No.: US 12,164,033 B2
(45) Date of Patent: Dec. 10, 2024

(54) LIDAR PROJECTION APPARATUS

(71) Applicant: Artilux, Inc., Menlo Park, CA (US)

(72) Inventors: Tim K. Shia, Zhubei (TW); Yun-Chung Na, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 919 days.

(21) Appl. No.: 17/216,515

(22) Filed: Mar. 29, 2021

(65) Prior Publication Data

US 2021/0333405 A1    Oct. 28, 2021

Related U.S. Application Data

(60) Provisional application No. 63/016,297, filed on Apr. 28, 2020.

(51) Int. Cl.
*G01S 17/894* (2020.01)
*B81B 3/00* (2006.01)
(Continued)

(52) U.S. Cl.
CPC .......... *G01S 17/894* (2020.01); *B81B 3/0018* (2013.01); *G01S 7/4817* (2013.01);
(Continued)

(58) Field of Classification Search
CPC ...... G01S 17/894; G01S 7/4817; G01S 7/484; G01S 7/486; G01S 7/4815; G01S 7/4816;
(Continued)

(56) References Cited

U.S. PATENT DOCUMENTS

| 5,673,284 A | 9/1997 | Congdon et al. |
| 7,090,133 B2 | 8/2006 | Zhu |

(Continued)

FOREIGN PATENT DOCUMENTS

| DE | 102008009180 A1 | 1/2009 |
| EP | 2626722 B1 | 9/2016 |

(Continued)

OTHER PUBLICATIONS

International Preliminary Report on Patentability and Written Opinion mailed Jan. 21, 2021, for PCT Application No. PCT/US2019/040873, filed Jul. 8, 2019, eight pages.

*Primary Examiner* — Michael C Zarroli
(74) *Attorney, Agent, or Firm* — Morrison & Foerster LLP

(57) ABSTRACT

Described are systems and methods for ToF imaging of a target. The ToF imaging system includes an optical splitter that splits the light beam from a light source into multiple transmitting light beams. The transmitting light beams are directed towards a target, and one or more portions return as reflected light beams. A detector generates detector signals, representative of the reflected light beams. An electronically-controlled mirror is used to change the angular position of the transmitting light beams incident on the target, so that different regions of the target can be measured at different time instants. The ToF imaging system uses a flash and scan process to flash one region(s) of the target with the transmitting light beams during one sub-frame exposure and to scan other region(s) of the target during subsequent sub-frame exposures. An image processing apparatus constructs target information from multiple sub-frame exposure.

15 Claims, 9 Drawing Sheets

(51) Int. Cl.
*G01S 7/481* (2006.01)
*G01S 7/484* (2006.01)
*G01S 7/486* (2020.01)

(52) U.S. Cl.
CPC .............. *G01S 7/484* (2013.01); *G01S 7/486* (2013.01); *B81B 2201/047* (2013.01)

(58) Field of Classification Search
CPC ....... G01S 17/42; G01S 17/89; B81B 3/0018; B81B 2201/047
See application file for complete search history.

(56) References Cited

U.S. PATENT DOCUMENTS

| | | |
|---|---|---|
| 7,202,776 B2 | 4/2007 | Breed |
| 7,961,301 B2 | 6/2011 | Earhart et al. |
| 8,050,570 B2 | 11/2011 | Schmitz et al. |
| 9,575,184 B2 | 2/2017 | Gilliland |
| 9,841,495 B2 | 12/2017 | Campbell |
| 10,139,491 B2 | 11/2018 | Takasuka et al. |
| 10,215,847 B2 | 2/2019 | Scheim |
| 10,215,859 B2 | 2/2019 | Steinberg |
| 2017/0285148 A1 | 10/2017 | Hipp |
| 2017/0329010 A1 | 11/2017 | Warke |
| 2018/0095175 A1* | 4/2018 | O'Keeffe ................ G01S 17/42 |
| 2019/0353787 A1 | 11/2019 | Petit |
| 2021/0356572 A1 | 11/2021 | Kadambi |
| 2022/0075064 A1* | 3/2022 | Schaale ................ H04N 23/80 |

FOREIGN PATENT DOCUMENTS

| | | |
|---|---|---|
| JP | 2000213931 A | 8/2000 |
| JP | 6424522 B2 | 11/2018 |
| WO | 2016187566 A2 | 11/2016 |
| WO | 2020014154 A1 | 1/2020 |

\* cited by examiner

LIDAR PROJECTION APPARATUS

CROSS-REFERENCE TO RELATED APPLICATION

This application claims the benefit of U.S. provisional application No. 63/016,297, filed on Apr. 28, 2020, the contents of which are incorporated here by reference in its entirety for all purposes.

FIELD

This disclosure relates generally to systems and methods for time of flight (ToF) imaging, and more specifically, to a ToF imaging system that utilizes an electronically-controlled mirror and implements a flash and scan process.

BACKGROUND

ToF imaging systems are used for many applications including cell phones, digital still cameras, vehicles, autonomous vehicles, automated equipment, human-machine interfaces, object scanning, gesture recognition, augmented reality, etc. A ToF imaging system may include a light emission apparatus that emits light towards a target and a light receiving apparatus that receives light returned (e.g., reflected) from the target. The ToF imaging system may determine information about the target, such as depth information, based on one or more properties of the return light. When large angular detection field of view of a ToF imaging system for relatively remote targets within the field is needed given safety-limited light power budget, where limited form factor may restrict beam expanding diameter and finite light beam propagation quality, a technical solution is needed in order to detect the remote targets and accurately determine information about them. However, the scanning process may make use of optics and mechanical mirror(s) that are bulky and expensive.

SUMMARY

Described herein are systems and methods for ToF imaging of a target. The ToF imaging system may include an optical splitter that splits the light beam from a light source into multiple transmitting light beams. The transmitting light beams are directed towards one or multiple targets and one or more portions of the transmitting light beams are reflected back as reflected light beams for a light receiving apparatus. A detector receives the reflected light beams and generates detector signals, representative of the reflected light beams. An electronically-controlled mirror is used to change the angular position of the transmitting light beams incident on the target(s), so that different regions of relatively large target(s) or multiple relatively small targets can be measured. The ToF imaging system uses a flash and scan process to flash and illuminate one region(s) of the target scene with the transmitting light beams during one sub-frame exposure and scan other region(s) of the target scene during subsequent sub-frame exposures. An image processing apparatus constructs target scene information from multiple sub-frame exposures.

Given finite transmitting peak light power, the ToF imaging system distributes available light beacon power into partial regions within the angular detection field of view in a single sub-frame exposure. Each of the distributed transmitting light beams, the beamlets, may have a smaller spot size and higher output power, resulting in enhanced signal-to-noise ratio (SNR) without compromising total power consumption, or the total power consumption of all beamlets at certain sub-frame exposure. The disclosed ToF imaging system is with a higher SNR than a conventional ToF imaging system due to spatial-temporal multiplexing of limited peak beacon light power and stitching intense interleaved beamlet images. The ToF imaging system may illuminate multiple regions of the target scene (and the corresponding reflected light beams may be incident on multiple groups of detector pixels) during a single sub-frame exposure, reducing the required time for a full frame-stitching and increasing the frame rate compared to what could be achieved by single light beam scanner. In some embodiments, the ToF imaging system may illuminate sub-regions of the target scene (and the corresponding reflected light beams may be incident on multiple sets of detector pixels) during a single sub-frame exposure, enhancing the resolution. The disclosed ToF imaging system may stitch information from multiple interleaved sub-frame exposures, obtaining a larger field of regard (FOR).

The use of an electronically-controlled mirror to scan the transmitting light beams may result in reduced weight, power, and size. In some embodiments, the number of moving parts may be reduced. Embodiments may include, but are not limited to, the electronically-controlled mirror being the only moving part in the ToF imaging system. The speed of the electronically-controlled mirror may also contribute to the higher frame rate. The electronically-controlled mirror may move in one or more directions (e.g., horizontally, vertically, or both), which may result in enhanced SNR, higher FOR, or both. The disclosure includes an electronically-controlled mirror having a rotational movement range to cover the total scanning regard between the separation angles between beamlets.

DETAILED DESCRIPTION

Figure 1:
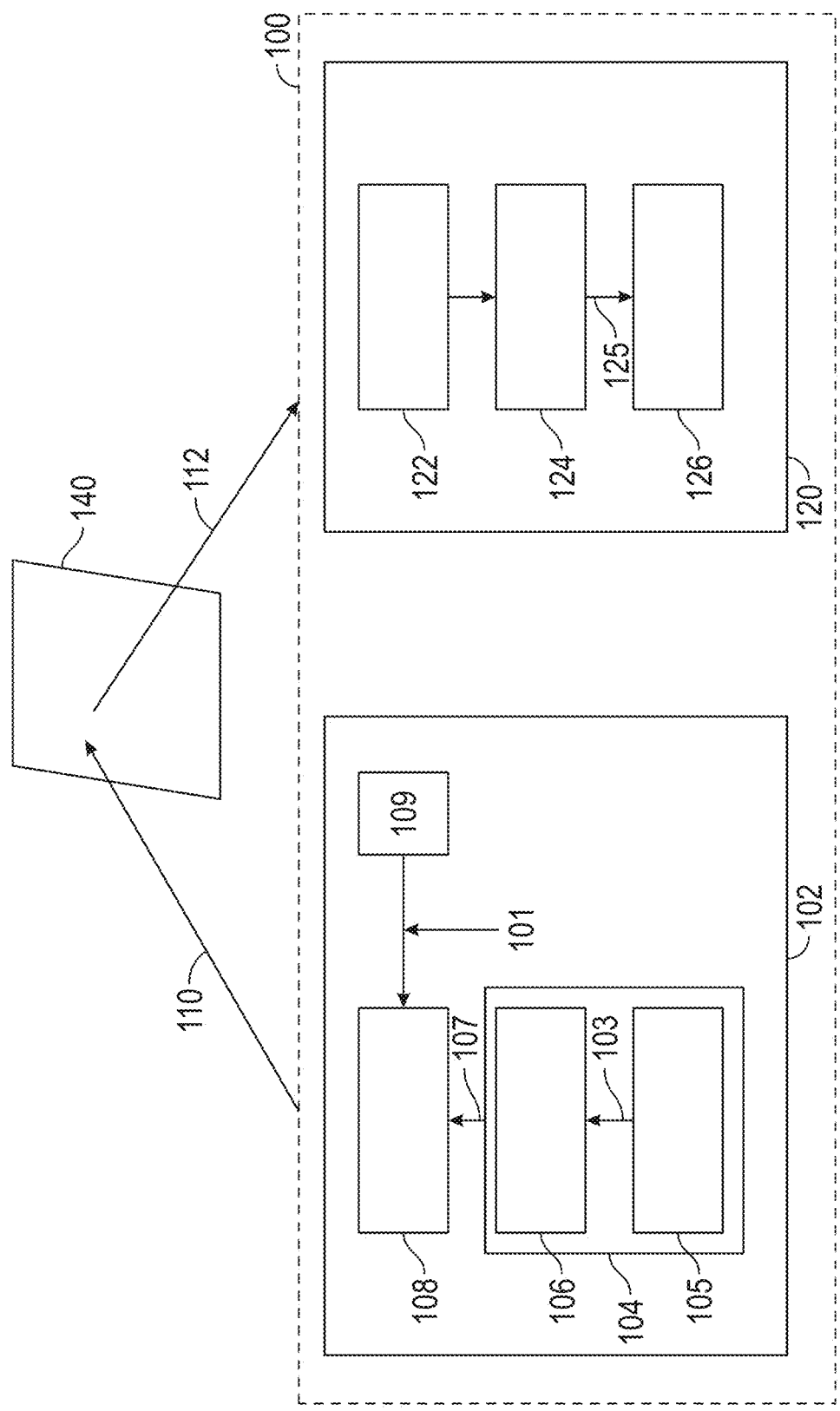
FIG. 1 illustrates a block diagram of an exemplary ToF imaging system, according to embodiments of the disclosure.

In the following description of examples, reference is made to the accompanying drawings in which it is shown by way of illustration specific examples that can be practiced. It is to be understood that other examples can be used and structural changes can be made without departing from the scope of the various examples.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

As used throughout this specification, a reference number without an alphabet character following the reference number can refer to one or more of the corresponding references, the group of all references, or some of the references. For example, "110" can refer to any one of the transmitting light beams (e.g., first transmitting light beam 110A, second transmitting light beam 110B, etc.), all of the transmitting light beams, or some (but not all) of the transmitting light beam(s).

A ToF imaging system may use a flash-only process for generating an image of the target scene. This flash-only process involves emitting a single pulse of light or modulated light to illuminate the target scene. In order to maintain sufficient illumination intensity and sufficient reflection light, the flash light source can illuminate very limited portion of the target scene, or the reflective targets must be located within a short distance (e.g., 10 meters) from the ToF imaging system.

One way to extend the distance range capability of a ToF imaging system without sacrificing its angular field of view may be to implement a scanning process. It would be desirable to have a ToF imaging system capable of imaging a target while being compact, lightweight, cost friendly, and robust. Embodiments of the disclosure include a ToF imaging system that uses a MEMS mirror steered beamlet patterning optics with reduced full-scale scanning. This configuration reduces the mass of inertia and lidar imaging processing needed without compromising frame rate or reflection intensity (as conventional imaging systems do).

Exemplary ToF Imaging System

FIG. 1 illustrates a block diagram of an exemplary ToF imaging system 100, according to embodiments of the disclosure. This block diagram may be used to explain the high-level details of the ToF imaging system, and more detailed descriptions are provided below. The ToF imaging system 100 may emit light towards a target 140 and may detect light returning (e.g., reflected) from the target 140. The ToF imaging system 100 may determine information about the target 140, such as depth information, based on one or more properties of the return light.

The ToF imaging system 100 may include a light emission apparatus 102 and a light receiving apparatus 120. When in operation, the light emission apparatus 102 may emit one or more transmitting light beams 110 towards a target 140. The transmitting light beams 110 may illuminate a portion or the entirety of the target 140. In some embodiments, the target 140 may be a three-dimensional (3D) object including, but not limited to, a person's face or body. A portion of the transmitting light beams 110 may return (e.g., reflect) from the target 140 as reflected light beams 112. The light receiving apparatus 120 may receive the one or more reflected light beams 112.

The light emission apparatus 102 may include a light source component 104 and first optics 108. The light source component 104 may include one or more light sources and may be configured to generate one or more light beams 107. The light source component 104 may include one or more controllers 105 and one or more light sources 106. The controller(s) 105 may be electrically coupled to the light source(s) 106 and may generate one or more control signals 103 to control the operation of the light source(s) 106.

The control signal(s) 103 may drive the light source(s) 106 to emit light with desired properties (e.g., pulse width, pulse repetition rate, peak/average power, intensity/polarity/wavelength modulation, etc.). The control signal(s) 103 may cause the light source(s) 106 to operate in one or more operation modes such as pulsed or continuously modulated light.

When in operation, the light source(s) 106 may generate the light beam(s) 107 in response to the control signal(s) 103 from the controller(s) 105. Exemplary type of light source 106 may include, but is not limited to, a vertical-cavity surface emitting laser (VCSEL), an edge emitting laser (EEL), a superluminescent diode (SLD), and a light emitting diode (LED). The light source(s) 106 may be capable of generating visible light, infrared (IR) light, near IR (NIR) light (e.g., wavelength range from 780 nm to 1400 nm, or a similar wavelength range as defined by a particular application), short-wavelength IR (SWIR) light (e.g., wavelength range from 1400 nm to 3000 nm, or a similar wavelength range as defined by a particular application), or a combination thereof. In some embodiments, each light source 106 may be configured to emit one light beam 107. The light source 106 may be a single laser package, for example. The light beam(s) 107 generated by the light source component 104 may be transmitted to the first optics 108.

The first optics 108 may receive the light beam(s) 107 from the light source component 104 and may adjust one or more properties of the light beam(s) 107. Adjusting one or more properties may include, but is not limited to, beam splitting, combining, steering, shaping, filter, diffusing, modulating, and converting the wavelength(s) of the light beam(s) 107. Exemplary optics in the first optics 108 may include, but is not limited to, a diffuser, a lens, an aperture window, a polarizer, a waveplate, a prism, a beam splitter, an attenuator, any other suitable optical components, or a combination thereof. The transmitting light beams 110 from the first optics 108 may be directed towards the target 140.

In some embodiments, the light emission apparatus 102 may include a controller 109 for controlling at least one of the first optics 108. The controller 109 may send control signals 101, for example. As discussed in more detail below with respect to FIGS. 2A and 2B, the first optics 108 may include one or more electronically-controlled mirrors (e.g., electronically-controlled mirror 220), such as a microelectromechanical (MEMS) mirror. The controller may control the movement (e.g., angle, movement rate, movement direction, etc.) of the electronically-controlled mirror 220. In some embodiments, the controller may synchronize the movement of the electronically-controlled mirror 220 with the light source(s) 106. For example, the controller 109 can control the electronically-controlled mirror 220 such that its movement has been stabilized before the light source(s) 106 generate a light beam. In some embodiments, a single controller may be used to control both the electronically-controlled mirror 220 and the light source(s) 106. In some embodiments, the controller 109 may control the movement of the electronically-controlled mirror 220 to achieve periodic scanning of target regions of an area.

The target 140 may receive a portion or the entirety of the transmitting light beams 110. Light may return (e.g., reflect) from the target 140 as reflected light beams 112, towards the light receiving apparatus 120.

The light receiving apparatus 120 may include second optics 122, a detector 124, and an image data processing apparatus 126. The second optics 122 may receive the reflected light beams 112 and may adjust one or more properties of the reflected light beams 112. Adjusting one or more properties may include, but is not limited to, beam splitting, attenuating, combining, steering, shaping, filter, focusing, modulating, switching, converting the wavelength(s) of the light beam(s) 112, and a combination thereof. Exemplary optics in the second optics 122 may include, but is not limited to, a light guide, a micro lens, and a wavelength filter (e.g., a bandpass filter).

The detector 124 may receive the reflected light beams 112 from the second optics 122 and may generate one or more detector signals 125 representative of the reflected light beams 112. In some embodiments, the detector 124 may include an array of detector pixels. Detector 124 may be any type of detector including, but not limited to, a broadband detector, a narrow band detector, and a focal plane array detector. The detector 124 may be capable of detecting visible light, IR light, NIR light, SWIR light, or a combination thereof. For example, the detector 124 may be capable of detecting light at 460 nm±40 nm, 540 nm±40 nm, 620 nm±40 nm, 850 nm±40 nm, 940 nm±40 nm, greater than 1 μm (e.g., 1310 nm, 1550 nm), etc. An exemplary detector may include, but is not limited to, a silicon detector, a germanium-on-silicon (GeSi) detector, or an indium gallium arsenide (InGaAs) detector. The details of example detectors are disclosed in U.S. patent application Ser. No. 17/005,288, filed on Aug. 27, 2020, incorporated by reference. In some embodiments, each detector pixel may generate a respective detector signal 125.

The image data processing apparatus 126 may receive the detector signal(s) 125, representative of the reflected light beams 112 received by the detector 124. The image data processing apparatus 126 may include one or more data processors. The image data processing apparatus 126 may determine information about the target 140 (e.g., target information) based on the detector signals 125. For example, the image data processing apparatus 126 may calculate the image depth information of the target 140 based on the detector signal(s) 125 from the detector 124. In some embodiments, the distance between the ToF imaging system 100 and the target 140 may be determined based on the phase shift between the transmitting light beams 110 and the reflected light beams 112. The image depth information may be based on this distance, for example. The image data processing apparatus 126 may stitch information from multiple sub-frame exposures to construct the target information, which may include one or more of image depth information, a 3D image, etc., as discussed below. In some embodiments, the image data processing apparatus 126 may also obtain spectrum information of the transmitting light beams 110. The target information may be constructed by illuminating different regions of the target 140 during different sub-frame exposures, determining the distance between the ToF imaging system 100 and the target 140 for each region, and then stitching the image depth information together. In some embodiments, the 3D image may be constructed in a single frame exposure. A single frame exposure may include multiple sub-frame exposures, for example.

Figure 2A:
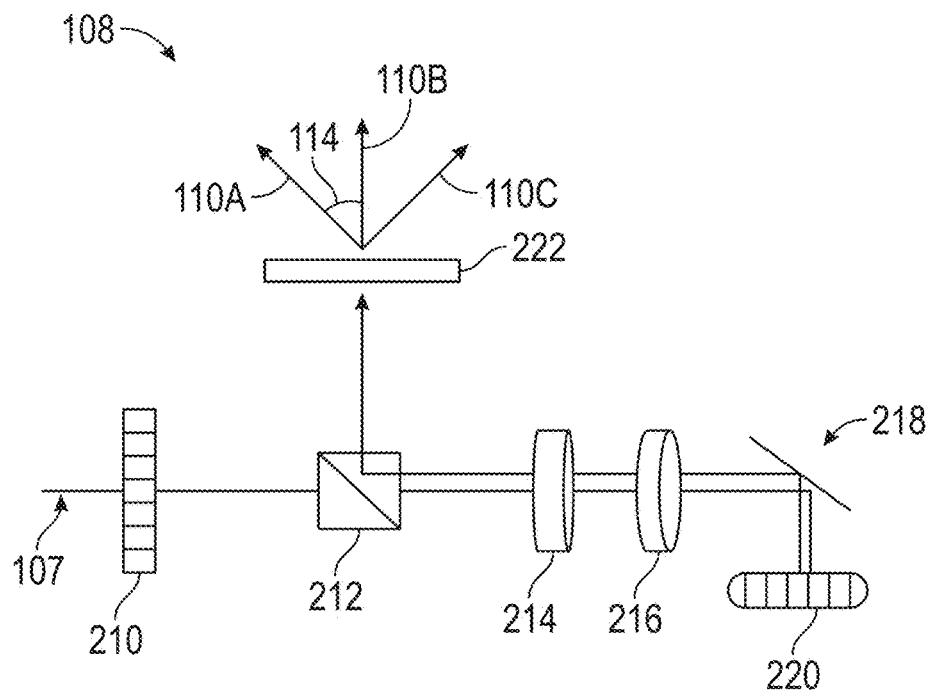
FIG. 2A illustrates an exemplary configuration for optics component included in a light emission apparatus, according to embodiments of the disclosure.

FIG. 2A illustrates an exemplary configuration for first optics 108 included in a light emission apparatus (e.g., light emission apparatus 102 of FIG. 1), according to embodiments of the disclosure. The first optics 108 may include at least an optical splitter 222 (e.g., an optical diffuser or a diffractive optical element) and an electronically-controlled mirror 220. The optical splitter 222 receives the light beam(s) reflected from the electronically-controlled mirror 220 and may split it into multiple transmitting light beams (e.g., 110A, 110B, 110C) directed towards the target 140 to obtain a desirable FOV. In some embodiments, the first optics 108 include a polarizer 210, a polarization beam splitter 212, a quarter-waveplate 214, a mirror 218, an electronically-controlled mirror 220, and an optical splitter 222. In some embodiments, the first optics 108 may further include a lens 216. In some embodiments, the first optics 108 may be located adjacent to the light source component 104, which may lead to a ToF imaging system 100 that is more compact and has reduced complexity in terms of assembly and alignment.

The polarizer 210 may receive one or more light beam(s) 107 from a light source component (e.g., light source component 104 of FIG. 1), as further discussed below with respect to FIGS. 3A and 3B. In some embodiments, the polarizer 210 may allow a specific polarization of the light beam(s) 107 to pass through and may block out other polarizations.

The polarization beam splitter 212 may receive the light beam(s) from the polarizer 210 and may direct the light beam(s) to the quarter-waveplate 214.

The quarter-waveplate 214 may receive the light beam(s) from the beam splitter 212 and may change one or more properties, such as the polarization state or phase.

The lens 216 may receive the light beam(s) from the quarter-waveplate 214 and may adjust one or more properties. In some embodiments, the lens 216 may focus, collimate, or expand the light beam(s) and direct the light beam(s) to mirror 218. Exemplary types of lens 216 may include, but are not limited to, a focusing lens, a slow-axis collimator and a fast-axis collimator.

The mirror 218 may receive the light beam(s) from the polarization beam splitter 212 or from the lens 216 and may redirect it to the electronically-controlled mirror 220. In some embodiments, the mirror 218 may be a stationary mirror.

The electronically-controlled mirror 220 may receive the light beam(s) from the mirror 218 and may redirect it back to the mirror 218. The electronically-controlled mirror 220 may receive one or more signals for adjusting one or more of its properties (e.g., amount of tilt). For example, the electronically-controlled mirror 220 may receive a current signal that adjusts its position (e.g., tilt), which may change the angle of the light beam(s) reflected from the electronically-controlled mirror 220. In some embodiments, for a given FOV, the range of tilt of the electronically-controlled mirror 220 during a frame exposure may be less than for a mechanical mirror. In some embodiments, the range of tilt of the electrically-controlled mirror 220 may be between 10°-20°. The electronically-controlled mirror 220 may be capable of changing its position faster than a mechanical mirror, to change the angle(s) of the light beam(s), thereby allowing the ToF imaging system 100 to operate with a higher frame rate, such as higher than 30 Hz, as one non-limiting example. In some embodiments, changing the position of the electronically-controlled mirror 220 may include rotating the electronically-controlled mirror about one or more axes.

The ToF imaging system 100 may be more suitable for a portable device than a conventional ToF imaging system. For example, the disclosed ToF imaging system 100 may be lighter and more compact. In some embodiments, the electronically-controlled mirror 220 may be the only moving part in the light emission apparatus 102, the ToF imaging system 100, or both. In some embodiments, the electronically-controlled mirror 220 may be a solid-state electronically-controlled mirror. The electronically-controlled mirror 220 may reduce the size and/or number of optics needed in the ToF imaging system 100 without compromising performance in combination with the optical splitter 222, such as FOV, FOR, or the like. Embodiments of the disclosure may include a ToF imaging system 100 having a higher SNR and a higher frame rate than a conventional ToF imaging system.

After the light beam(s) is reflected back from the electronically-controlled mirror 220, the mirror 218 may receive the light beam(s) from the electronically-controlled mirror 220 and may redirect it towards the lens 216. The lens 216 may receive the light beam(s) from the mirror 218 and may adjust one or more properties. In some embodiments, the lens 216 may be a multi-purpose lens that focuses the light beam(s) directed to mirror 218 and collimates the light beam(s) received from the electronically-controlled mirror 220, depending on the path of the light beam(s). The quarter-waveplate 214 may receive the light beam(s) from the lens 216 and may direct it to the polarization beam splitter 212. The beam splitter 212 may receive the light beam(s) from the quarter-waveplate 214 (where the light beam(s) has experienced a 90-degree phase-shift) and may direct it towards the optical splitter 222. The optical splitter 222 may receive the light beam(s) from the beam splitter 212 and may split it into multiple transmitting light beams 110 (e.g., at least three transmitting light beams 110). For example, the optical splitter 222 may generate first transmitting light beam 110A, second transmitting light beam 110B, and third transmitting light beam 110C. The first transmitting light beam 110A, the second transmitting light beam 110B, and the third transmitting light beam 110C may form the transmitting light beams 110 directed towards the target 140. Exemplary optical splitters 222 may include, but is not limited to, a diffuser or a grating.

The ToF imaging system 100 may have reduced power consumption compared to a conventional ToF imaging system. Since the beam splitter 212 splits the light beam(s) into multiple light beams 110, the light source(s) 106 may be operated with lower output power without compromising performance, such as FOV, FOR, SNR, resolution, frame rate, etc.

In some embodiments, the first optics 108 may separate the beams such that there is a non-zero angle 114 (e.g., spatially separated) between adjacent transmitting light beams 110. For example, the optical splitter 222 may create an angle 114 of not higher than 40° (e.g., 10°-20°) between adjacent transmitting light beams 110 (e.g., first transmitting light beam 110A and second transmitting light beam 110B). The angle 114 may be measured from the center of the transmitting light beams 110. In some embodiments, during a sub-frame exposure, the transmitting light beams 110 may illuminate one or more regions of the target 140 (e.g., illuminated regions), and the first optics 108 may separate the transmitting light beams 110 such that there are non-illuminated regions of the target 140 between illuminated regions.

The FOV of all the transmitting light beams 110 combined together may be greater than the FOV of each individual transmitting light beam 110. For example, the FOV of all transmitting light beams 110 combined together may be 120 degrees, as one non-limiting example.

In some embodiments, the first optics 108 may change the shape, size, or both, of the light beam(s) 107. In some embodiments, the first optics 108 may change the shape, size, or both of each transmitting light beam 110. Exemplary shape may include, but is not limited to, rectangular, elliptical, circular, and the like.

Figure 2B:
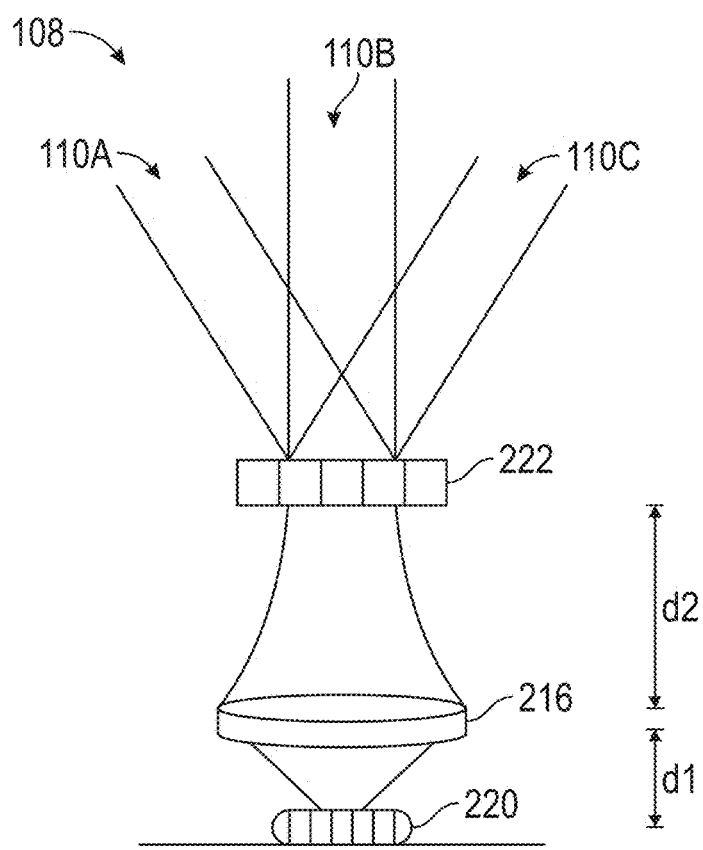
FIG. 2B illustrates a diagram of optics component included in a light emission apparatus, according to embodiments of the disclosure.

In some embodiments, the first optics 108 may be configured with distances between components based on one or more focal lengths. FIG. 2B illustrates a block diagram of first optics 108 included in a light emission apparatus (e.g., light emission apparatus 102 of FIG. 1), according to embodiments of the disclosure. The electronically-controlled mirror 220 may be located a distance d2 away from the lens 216. The optical splitter 222 may be located a distance d1 away from the lens 216. In some embodiments, distance d1, distance d2, or both may correspond to the focal length of the lens 216. The optical splitter 222 may split the light beams and output the plurality of light beams 110A, 110B, and 110C. As an example, if the light beam(s) 107 is a collimated beam having a beam waist that is larger than the diameter of the electronically-controlled mirror 220, the lens 216 may be placed along the optical path to focus the light beam(s) onto the electronically-controlled mirror 220. As another example, if the light beam(s) 107 is a diverging beam, the lens 216 may be placed along the optical path to collimate the diverging beam(s) into a collimated beam having a beam waist close to the electronically-controlled mirror 220, and direct the collimated beam towards the electronically-controlled mirror 220. Although not shown in FIG. 2B, in some implementations, other optical elements (e.g., the polarization beam splitter 212, the quarter-waveplate 214, and/or the mirror 218) may be placed along the optical path.

Figure 3A:
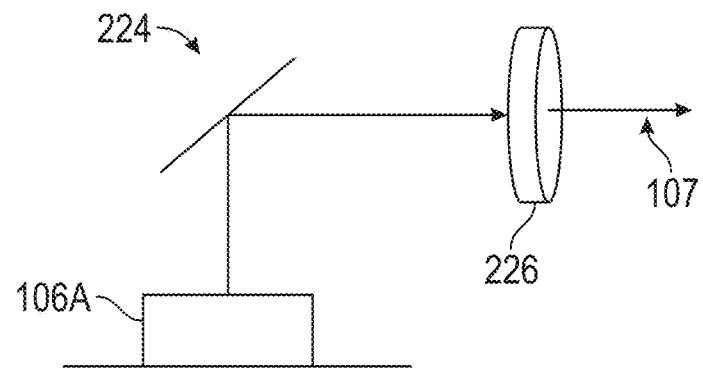
FIG. 3A illustrates an exemplary configuration for a vertical-cavity surface emitting laser (VCSEL) diode, according to embodiments of the disclosure.

FIG. 3A illustrates an exemplary configuration for a light source 106, according to embodiments of the disclosure. The light source 106A may be a surface emitting laser, such as a VCSEL. The VCSEL diode 106A may emit a light beam having a circular shape. The VCSEL diode 106A may emit light beam(s) towards a mirror 224. The mirror 224 may receive the light beam(s) from the VCSEL diode 106A and may redirect it to a lens 226, for example. The lens 226 may receive the light beam(s) and may adjust one or more properties. For example, the lens 226 may collimate and/or focus the light beams. The lens 226 may then transmit the light beam(s) 107 towards the first optics 108.

Alternatively, in some embodiments, the light source 106B may be an edge emitting laser (EEL). An exemplary configuration for a light source including an EEL is shown in FIG. 3B. The EEL diode 106B may emit light beam(s) towards lens 226. An EEL diode 106B may emit a light beam having an elliptical shape. The light beam(s) from the EEL diode 106B may be transmitted to lens 226, which may receive the light beam(s) and may adjust one or more properties. For example, the lens 226 may collimate and/or focus the light beams. The lens 226 may then transmit the light beam(s) 107 towards the first optics 108.

Figure 3B:
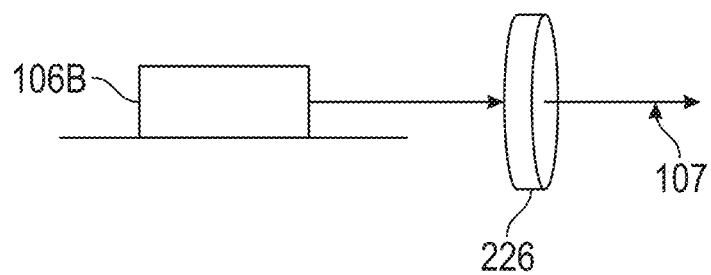
FIG. 3B illustrates an exemplary configuration for an edge emitting laser (EEL) diode, according to embodiments of the disclosure.
Figure 4:
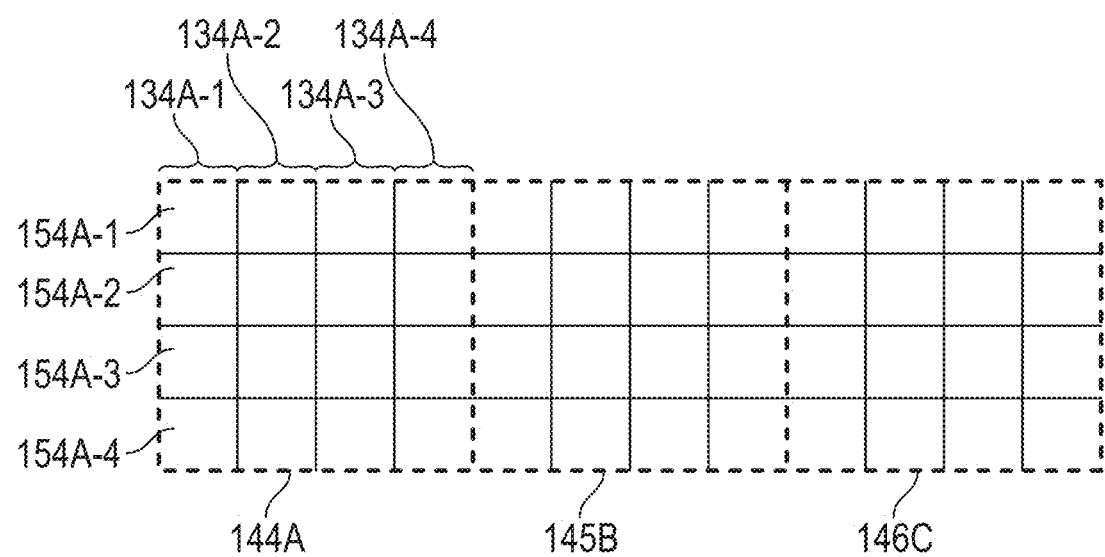
FIG. 4 illustrates a top view of an exemplary detector, target, or both, according to embodiments of the disclosure.

After one or more beams are emitted by a light source component 104 (such as shown in FIGS. 3A and 3B) and pass through first optics 108 (such as shown in FIGS. 2A and 2B), light may return (e.g., reflect) from the target 140 as reflected light beams 112, towards the light receiving apparatus 120 having a detector 124. The detector 124 may include any array of detector pixels. FIG. 4 illustrates a top view of an exemplary detector, target, or both, according to embodiments of the disclosure and as discussed below. This disclosure discusses the detector pixels in terms of groups of detector pixels and sets of detector pixels. A group refers to detector pixels that are illuminated by the same reflected light beam 112. Different groups may be illuminated by different reflected light beams 112 during the same sub-frame exposure. By illuminating multiple groups during the same sub-frame exposure, the time for a frame exposure may be reduced (relative to a ToF imaging system using a scanning process, for example).

A set of detector pixels refers to detector pixels that are included in a group. Different sets within a group may be illuminated by the same reflected light beam during different sub-frame exposures. By illuminating different sets within a group during different sub-frame exposures, the resolution of the ToF imaging system may be enhanced (relative to a ToF imaging system using a flash-only process, for example).

In some embodiments, the number of groups of detector pixels may be equal to the number of transmitting light beams 110 split by the first optics 108. For example, as shown FIG. 4, the detector 124 may include three groups of detector pixels: a first group 144A, a second group 145B, and a third group 146C. Each group may receive a different reflected light beam 112 during a sub-frame exposure. For example, the first group 144A may receive a first reflected light beam 112A, the second group 145B may receive a second reflected light beam 112B, and a third group 146C may receive a third reflected light beam 112C (not shown in FIG. 4).

As discussed, a group may include one or more sets of one or more detector pixels. For example, the first group 144A may include a first set 134A-1, a second set 134A-2, a third set 134A-3, and a fourth set 134A-4. In some embodiments, the number of sets may be equal to the number of sub-frame exposures in a frame exposure. For example, the detector pixels within a group may be assigned to four sets, and a frame exposure may include four sub-frame exposures.

As discussed in more detail below, in some embodiments, each set within a group may receive a respective reflected light beam 112 at a different time (e.g., a different sub-frame exposure). For example, the first set 134A-1 may receive the first reflected light beam 112A at a first sub-frame exposure T1, the second set 134A-2 may receive the first reflected light beam 112A during a second sub-frame exposure T2, the third set 134A-3 may receive the first reflected light beam 112A during a third sub-frame exposure T3, and a fourth set 134A-4 may receive the first reflected light beam 112A during a fourth sub-frame exposure T4.

A set 134 may include one or more detector pixels. For example, the first set 134A-1 may include detector pixels 154A-1, 154A-2, 154A-3, and 154A-4. In some embodiments, each of the sets within a group may have the same number of detector pixels.

One exemplary assignment of the detector pixels in groups and sets is shown in FIG. 4. In the example shown, each group includes multiple (e.g., four) sets, and each set includes multiple (e.g., four) detector pixels. Embodiments of the disclosure may include other assignments; another example is provided in FIG. 8 and discussed below.

In some embodiments, the regions of the target 140 may be illuminated by transmitting light beams 110 in a corresponding manner as the reflected light beams 112 are incident on the detector pixels. FIG. 4 may be illustrative of the regions of the target 140 illuminated by the transmitting light beams 110. Embodiments of the disclosure include illuminating multiple regions of the target during the same sub-frame exposure. Additionally or alternatively, multiple sub-regions of the target may be illuminated during the same sub-frame exposure.

Exemplary Operation of a ToF Imaging System

Figure 5:
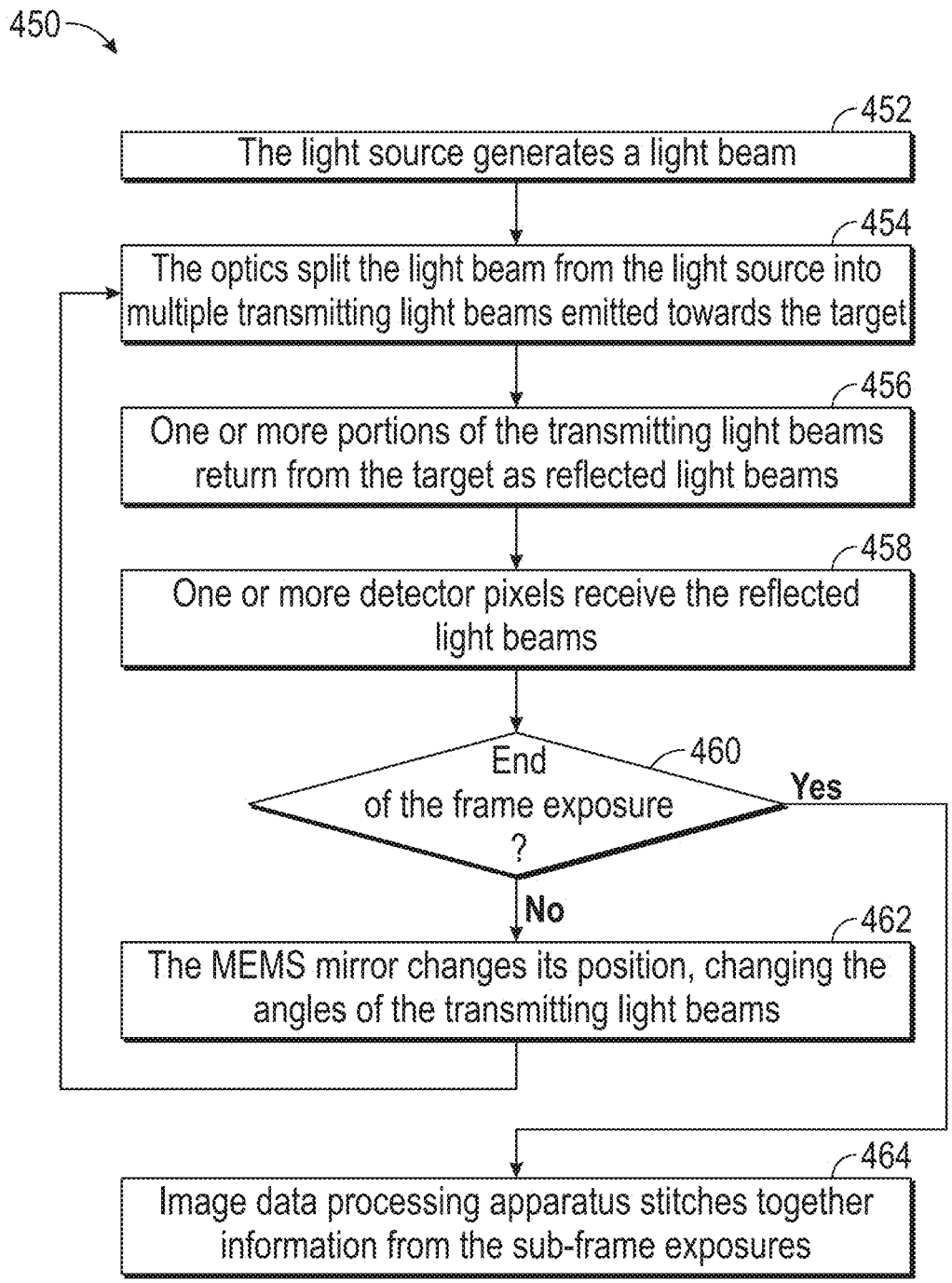
FIG. 5 illustrates a flow chart of an exemplary flash and scan process, according to embodiments of the disclosure.

Embodiments of the disclosure may include operating a ToF imaging system using a flash and scan process. FIG. 5 illustrates a flow chart of an exemplary flash and scan process 450, according to embodiments of the disclosure.

In step 452, the light emission apparatus 102 may perform a flash step by having the light source component 104 generate a light beam 107. During a flash step, the light source component 104 turns on, and the light emission apparatus 102 begins illuminating one or more regions of a target 140 with one or more transmitting light beams 110. In some embodiments, the electronically-controlled mirror 220 may be stationary during the flash step. The electronically-controlled mirror 220 may be kept stationary during a sub-frame exposure, for example. In some embodiments, a controller may configure the position of the electronically-controlled mirror 220 before the flash step (e.g., sub-frame exposure) begins.

The first optics 108 may split the light beam 107 from the light source component 104 into multiple transmitting light beams 110 emitted towards the target 140 (step 454 of process 450). The power of the light beam 107 from the light source component 104 may be split among the transmitting light beams 110. Each of the transmitting light beams 110 may have a smaller spot size and higher power light beam (than a non-split light beam). This higher power light beams may result in enhanced SNR without compromising power consumption.

The use of multiple transmitting light beams may result in a wider FOV. The multiple transmitting light beams may illuminate multiple regions of the target (and the corresponding reflected light beams may be incident on multiple groups of detector pixels) during the same sub-frame exposure, reducing the time for a frame exposure and increasing the frame rate. In some embodiments, the ToF imaging system may illuminate sub-regions of the target (and the corresponding reflected light beams may be incident on multiple sets of detector pixels) during the same sub-frame exposure, enhancing the resolution.

In some embodiments, the first optics 108 may change or maintain one or more properties (e.g., shape, size, etc.) of the light beam 107, the transmitting light beams 110, or both. For example, the shape of a transmitting light beam 110 may be rectangular. The first optics 108 may receive a circular light beam (e.g., from a VCSEL diode) or an elliptical light beam (e.g., from an EEL diode) and may include an elliptical lens to change the shape of the light beam (e.g., rectangular, square, elliptical, circular, etc.).

One or more portions of the transmitting light beams 110 return from (e.g., reflect) the target 140 as reflected light beams 112 (step 456 of process 450). For example, a first reflected light beam 112A may be a return of a first transmitting light beam 110A, a second reflected light beam 112B may be a return of a second transmitting light beam 110B, and a third reflected light beam 112C may be a return of a third transmitting light beam 110C.

A light receiving apparatus 120 may include a detector 124 having an array of detector pixels. One or more detector pixels may receive the reflected light beams 112 and may generate one or more detector signals, representative of the reflected light beams 112 (step 458 of process 450).

Figure 6:
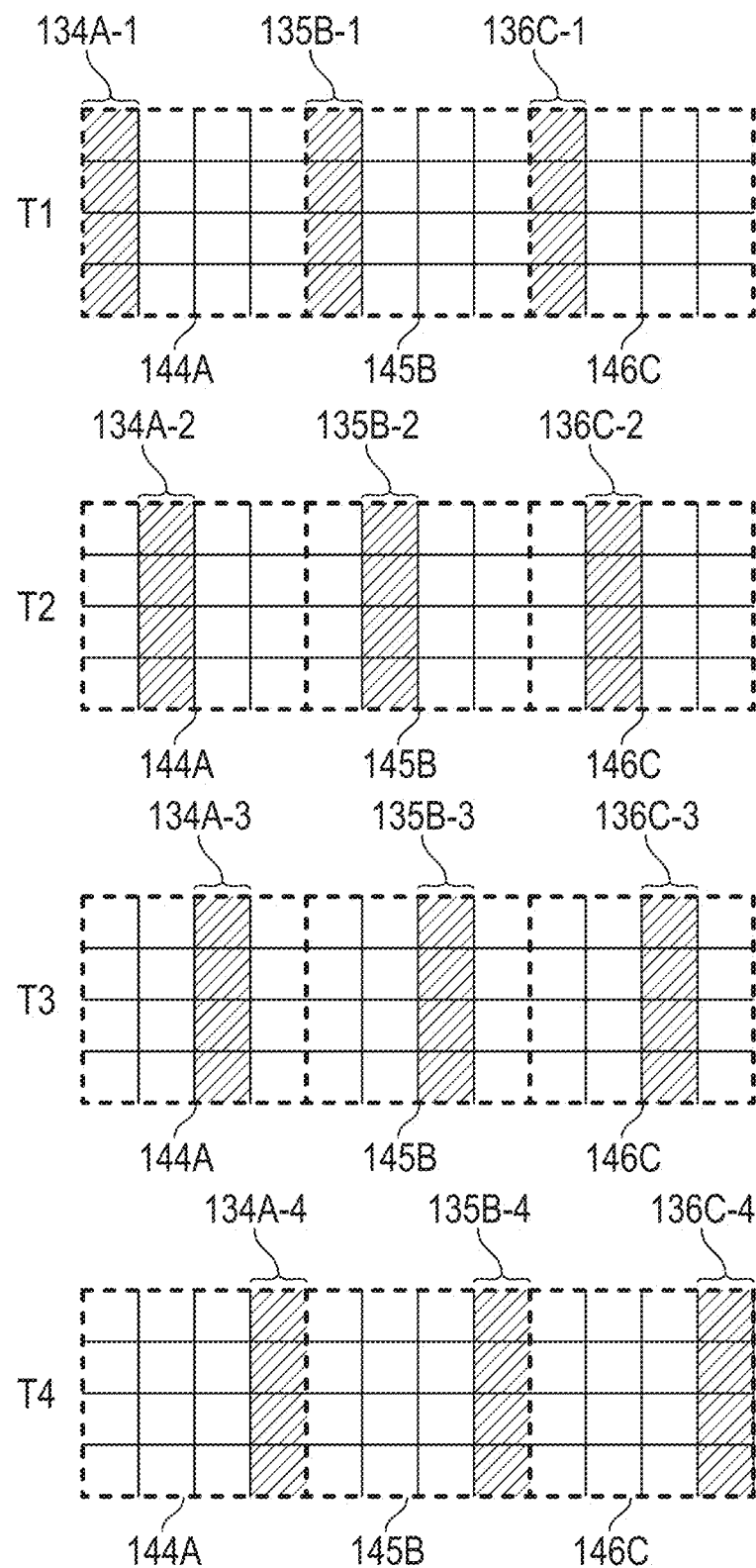
FIG. 6 illustrates a top view of a detector for multiple sub-frame exposures in an exemplary flash and scan process, according to embodiments of the disclosure.

In some embodiments, the detector 124 may be on when illuminated by reflected light beams 112 and off when not illuminated. Embodiments of the disclosure may include configuring one or more targeted detector pixels of the detector array 124 to be on while other detector pixels are off. For example, detector pixels of the first set 134A-1 may be targeted detector pixels that are on during the first sub-frame exposure T1 (as shown by the shading of FIG. 6), while the second set 134A-2 may be off. In this manner, if the second set 134A-2 receives a portion of first reflected light beam 112A, it may not generate detector signals. By configuring some detector pixels to be off during a sub-frame exposure, generation of signals representative of residual (e.g., unwanted scatter) incident light may be reduced, and the accuracy of the target information may be enhanced.

In some embodiments, different detector pixels may receive different reflected light beams. FIG. 6 illustrates a top view of a detector for multiple sub-frame exposures in an exemplary flash and scan process, according to embodiments of the disclosure. The same sets of detector pixels from different groups may receive different reflected light beams 112. For example, first set 134A-1 of group 144A may receive first reflected light beam 112A, first set 135B-1 of group 145B may receive second reflected light beam 112B, and a first set 136C-1 of group 146C may receive a third reflected light beam 112C.

In some embodiments, the spot size of at least one transmitting light beam 110 (generated in step 452) may be larger than the size of a single detector pixel, allowing the transmitting light beam to be incident on multiple detector pixels. For example, during a first sub-frame exposure T1, the first reflected light beam 112A may be incident on the first set 134A-1. As shown in the figure, the first set 134A-1 may include multiple detector pixels (e.g., detector pixels 154A-1, 154A-2, 154A-3, and 154A-4 of FIG. 4), so the plurality of detector pixels within the first set 134A-1 may be illuminated by the reflected light beam 112 during the first sub-frame exposure T1.

Returning back to FIG. 5, in step 460, the ToF imaging system 100 may determine whether the end of the frame exposure has been reached. If not, then the ToF imaging system 100 may proceed to the next sub-frame exposure.

In step 462, the light emission apparatus 102 may perform a scan step by changing the position of the electronically-controlled mirror 220. When the electronically-controlled mirror 220 changes its position, it changes the angle(s) of the light beam (including transmitting light beams 110 split by the first optics 108). The change in angle(s) may result in moving the transmitting light beams 110, which may then change the illumination region(s) of the target 140. The reflected light beams 112 may also move. The use of an electronically-controlled mirror to scan the transmitting light beams may result in reduced weight, power, and size.

The change in position of the electronically-controlled mirror 220 and the movement of the reflected light beams 112 may be in one or more directions. For example, the first reflected light beam 112A may move to the right during a second sub-frame exposure T2 and may be incident on a second set 134A-2 (of the first group 144A), as shown in FIG. 6. In some embodiments, the movement of the reflected light beams 112 may be along a predetermined path (e.g., in one direction such as to the right, or in multiple directions such as creating a one-dimensional or two-dimensional pattern that resembles the letter S, the letter Z, a zigzag, etc.). In this manner, the illuminated regions scanned by the ToF imaging system may be divided horizontally, vertically, or both, which may result in enhanced SNR, higher FOR, or both without increasing the amount the electronically-controlled mirror moves.

In some embodiments, the change in position of the electronically-controlled mirror 220 may also move the other reflected light beams 112, such as the second reflected light beam 112B and the third reflected light beam 112C. For example, during the second sub-frame exposure T2, the second reflected light beam 112B may be incident on a second set 135B-2 (of the second group 145B), and the third reflected light beam 112C may be incident on a second set 136C-2 (of the third group 146C).

In subsequent sub-frame exposures, step 462 may continue moving the transmitting light beams 110 along a predetermined path (e.g., to the right relative to the flash step 452 for the same frame exposure). For example, during the third sub-frame exposure T3, the first reflected light beam 112A may be incident on a third set 134A-3 (of the first group 144A), the second reflected light beam 112B on a third set 135B-3 (of the second group 145B), and the third reflected light beam 112C on a third set 136C-3 (of the third group 146C). During the fourth sub-frame exposure T4, the first reflected light beam 112A, the second reflected light beam 112B, and the third reflected light beam 112C may be incident on the fourth sets 134A-4, 135B-4, and 136C-4, respectively.

In some embodiments, the electronically-controlled mirror 220 may change to a predetermined position (e.g., change its tilt to a predetermined angle at predetermined time intervals). For example, the electronically-controlled mirror 220 may have a tilt of 10° during the first sub-frame exposure T1 (flash step), a tilt of 12° during the second sub-frame exposure T2 (scan step), a tilt of 14° during the third sub-frame exposure T3 (scan step), and a tilt of 16° during the fourth sub-frame exposure T4 (scan step). Each predetermined tilt may correspond to a different sub-frame exposure. The predetermined time intervals may be between sub-frame exposures so that the electronically-controlled mirror 220 does not move during a sub-frame exposure.

The total scanning angle of a given transmitting light beam 110 for a frame exposure may be small (e.g., less than 10°). In some embodiments, the total scanning angle of a given transmitting light beam 110 may be equal to the angle 114 between adjacent transmitting light beams 110 from the first optics 108.

Referring back to FIG. 5, when the end of the frame exposure has not been reached, steps 454-460 are repeated for subsequent scan steps. In some embodiments, the light source component 104 and the illumination of its light beam 107 (generated during a flash step) are maintained during a scan step. For example, the properties of the light beam 107 may be the same during all scan steps of a frame exposure, including the light beam 107 not being turned off until the end of the frame exposure. In some embodiments, the pulse width of the light source 106 may be greater than or equal to the duration of a frame exposure.

In this manner, in a frame exposure, a first set (e.g., first set 134A-1) receives a reflected light beam (e.g., first reflected light beam 112A) during a flash step of a first sub-frame exposure T1. One or more other sets of detector pixels (e.g., second set 134A-2, third set 134A-3, and fourth set 134A-4) receive the reflected light beam 112A during one or more scan steps of subsequent sub-frame exposures (e.g., second sub-frame exposure T2, third sub-frame exposure T3, fourth sub-frame exposure T4, etc.). The light source component 104 turns on for the flash step and maintains illumination for the scan step(s).

If the end of the frame exposure has been reached (determined in step 460), the image data processing apparatus 126 stitches together information from the sub-frame exposures to construct the target information (step 464 of process 450), for example Embodiments of the disclosure include using signal averaging, spatial binning, or both for the stitching. A peak signal filtering may prevent low outliers of signal strength from joining the signal averaging along the temporal axis for the same pixels. The peak signal filtering may additionally or alternatively prevent low outliers of signal strength from joining the spatial binning for adjacent pixels around peak signal pixels. The result may be a larger FOR. In some embodiments, at the end of a frame exposure, all detector pixels in the detector 124 have been illuminated.

A frame exposure may comprise multiple sub-frame exposures. For example, one frame exposure may comprise four sub-frame exposures. In some embodiments, a single frame exposure may comprise one flash step and at least one (e.g., multiple) scan steps. In some embodiments, a single frame exposure may comprise at least one (e.g., multiple) flash steps.

In some embodiments, the target 140 may be scanned multiple times, e.g., to enhance the accuracy of the target information. Process 450 may be repeated, and the ToF imaging system 100 may capture multiple frame exposures. The image data processing apparatus 126 may construct the target information between frame exposures, or may wait until after multiple frame exposures have been captured.

In some embodiments, information from a first frame exposure may be used to control the electronically-controlled mirror 220 for a second frame exposure. For example, the first frame exposure may capture a rough image of the target 140, such as determining whether and where the target 140 is located in the scene. The ToF imaging system 100 may adjust one or more properties of the electronically-controlled mirror 220 for the second frame exposure to capture a more accurate image of the target 140. The movement of the electronically-controlled mirror 220 may change, such as using a slower movement rate and/or a smaller tilt between sub-frame exposures), for the second frame exposure to increase the resolution.

Figure 7A:
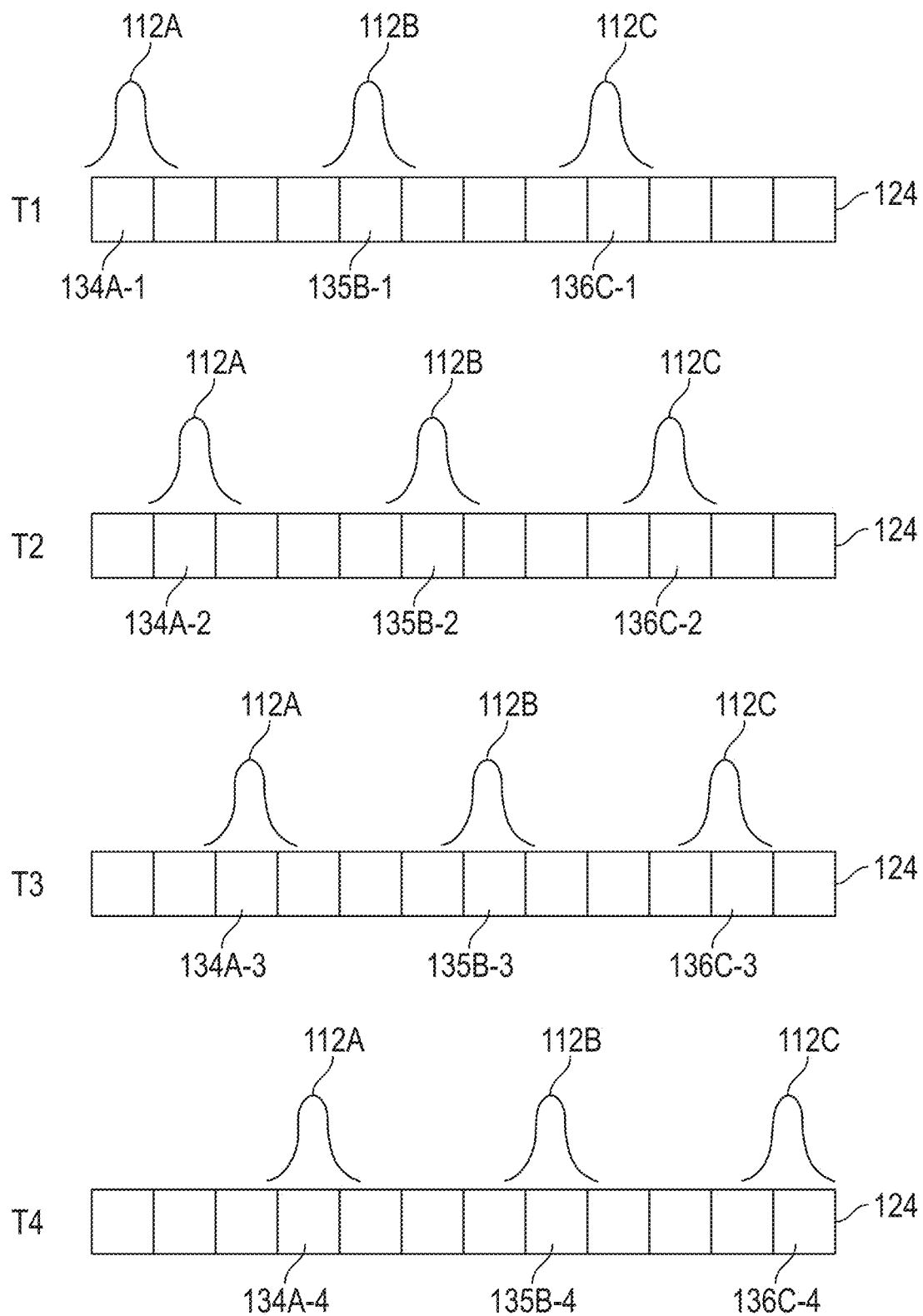
FIG. 7A illustrates an exemplary light power distribution at a detector using any of the disclosed flash and scan processes, according to embodiments of the disclosure.

FIG. 7A illustrates an exemplary light power distribution at the detector 124 using any of the disclosed flash and scan processes, according to embodiments of the disclosure. As discussed above, the ToF imaging system 100 may capture multiple sub-frame exposures in a single frame exposure. During a sub-frame exposure, different sets of detector pixels may receive different incident reflected beams 112. A group of detector pixels may receive the same reflected light beam 112. One set in a group may receive a reflected light beam 112 during a flash step, and other sets of detector pixels in the group may receive the reflected light beam 112 during subsequent scan steps. The flash step may be one sub-frame exposure, and the subsequent scan steps may be multiple sub-frame exposures.

For example, during the first sub-frame exposure T1, the first sets 134A-1, 135B-1, and 136C-1 for groups 144A, 145B, and 146C, respectively, may receive reflected light beams 112A, 112B, and 112C, respectively and as shown, and may generate corresponding detector signals. During the second sub-frame exposure T2, the second sets 134A-2, 135B-2, and 136C-2 for groups 144A, 145B, and 146C, respectively, may receive reflected light beams 112A, 112B, and 112C, respectively. Similarly, during the third sub-frame exposure T3, the third sets 134A-3, 135B-3, and 136C-3 for groups 144A, 145B, and 146C, respectively, may receive reflected light beams 112A, 112B, and 112C, respectively. During the fourth sub-frame exposure T4, the fourth sets 134A-4, 135B-4, and 136C-4 for groups 144A, 145B, and 146C, respectively, may receive reflected light beams 112A, 112B, and 112C, respectively.

Figure 7B:
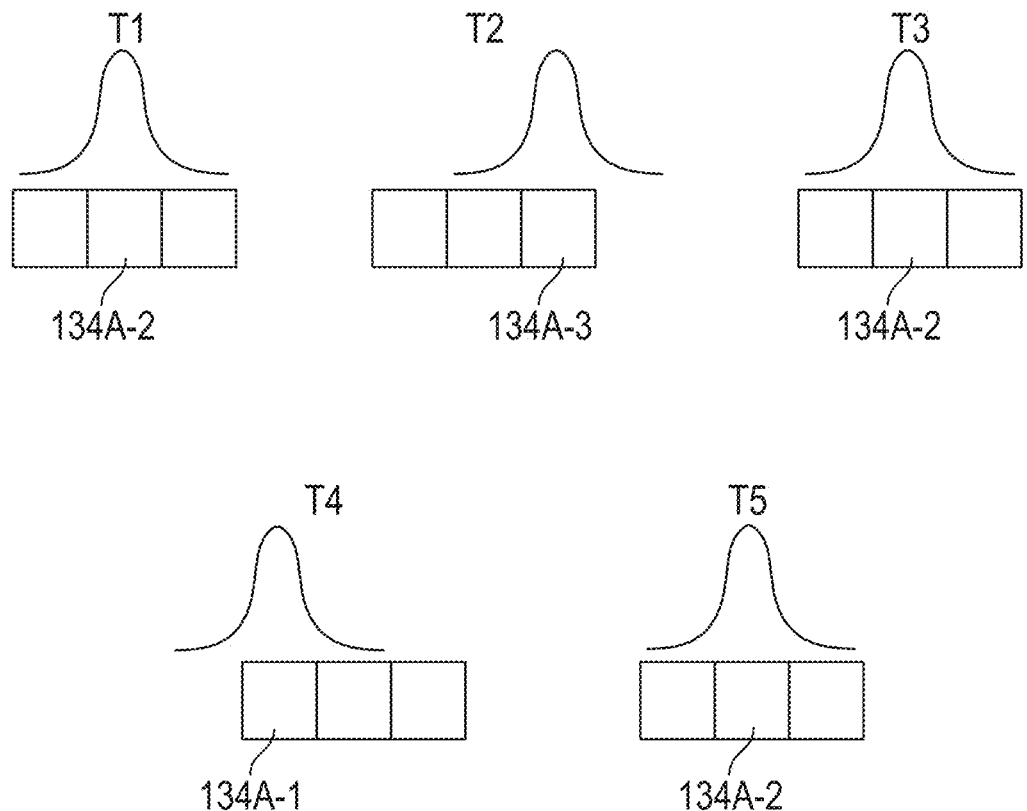
FIG. 7B illustrates an exemplary light power distribution at a detector using any of the disclosed flash and scan processes, according to embodiments of the disclosure.

Embodiments of the disclosure may include performing multiple scans of a selected target region(s) to enhance SNR and resolution. FIG. 7B illustrates an exemplary light power distribution at the detector 124, according to embodiments of the disclosure. The ToF imaging system 100 may select one or more target regions to image during multiple sub-frame exposures in a given frame exposure. The corresponding detector pixel(s) may similarly receive a reflected light beam during multiple sub-frame exposures.

For example, as shown in FIG. 7B, the detector pixel 134A-2 may receive a reflected light beam corresponding to the selected target region. In some embodiments, in between imaging the selected targeted region, the ToF imaging system may image surrounding regions. For example, the ToF imaging system may image the selected target region during the first sub-frame exposure T1. The electronically-controlled mirror 220 may move the transmitting light beam to image a region to the right of the selected target region in the second sub-frame exposure T2, and the detector pixel 134A-3 may generate the corresponding detector signal(s). For the third sub-frame exposure T3, the electronically-controlled mirror 220 may move the transmitting light beam back to the selected target region, and the detector pixel 134A-2 may generate the corresponding detector signal(s). For the fourth sub-frame exposure T4, the electronically-controlled mirror 220 may move the transmitting light beam to image a region to the left of the selected target region, and the detector pixel 134A-1 may generate corresponding detector signal(s). Then, for the fifth sub-frame exposure T5, the selected target region may be imaged again, and the detector signal from the detector pixel 134A-2 may be representative.

Figure 8:
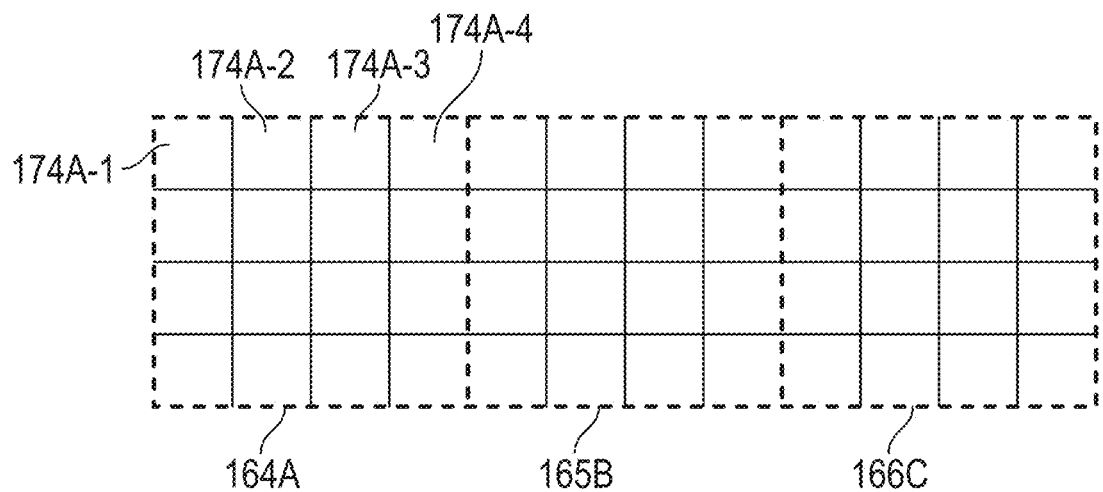
FIG. 8 illustrates a top view of a detector, target, or both, according to embodiments of the disclosure.

In some embodiments, the electronically-controlled mirror 220 may move the transmitting light beams 110 in multiple directions, such as horizontal and vertical directions. The detector pixels may be assigned such that each group includes one or more sets, and each set includes a single detector pixel, as shown in FIG. 8. Regions of the target 140 may be similarly assigned. Embodiments of the disclosure may include each set including multiple detector pixels (not shown), and the electronically-controlled mirror 220 moving the transmitting light beams 110 in both horizontal and vertical directions.

As shown FIG. 8, the detector 124 may include three groups of detector pixels: a first group 164A, a second group 165B, and a third group 166C. In some embodiments, each group may receive a different reflected light beam 112 during a frame exposure. For example, the first group 164A may receive a first reflected light beam 112A, the second group 165B may receive a second reflected light beam 112B, and a third group 166C may receive a third reflected light beam 112C.

The first group 164A may include a first set 174A-1, a second set 174A-2, a third set 174A-3, etc. Although the figure illustrates the first group 164A as including 16 sets, embodiments of the disclosure may include any number of sets. In some embodiments, each set within a group may receive a respective reflected light beam 112 during different sub-frame exposures.

Figure 9:
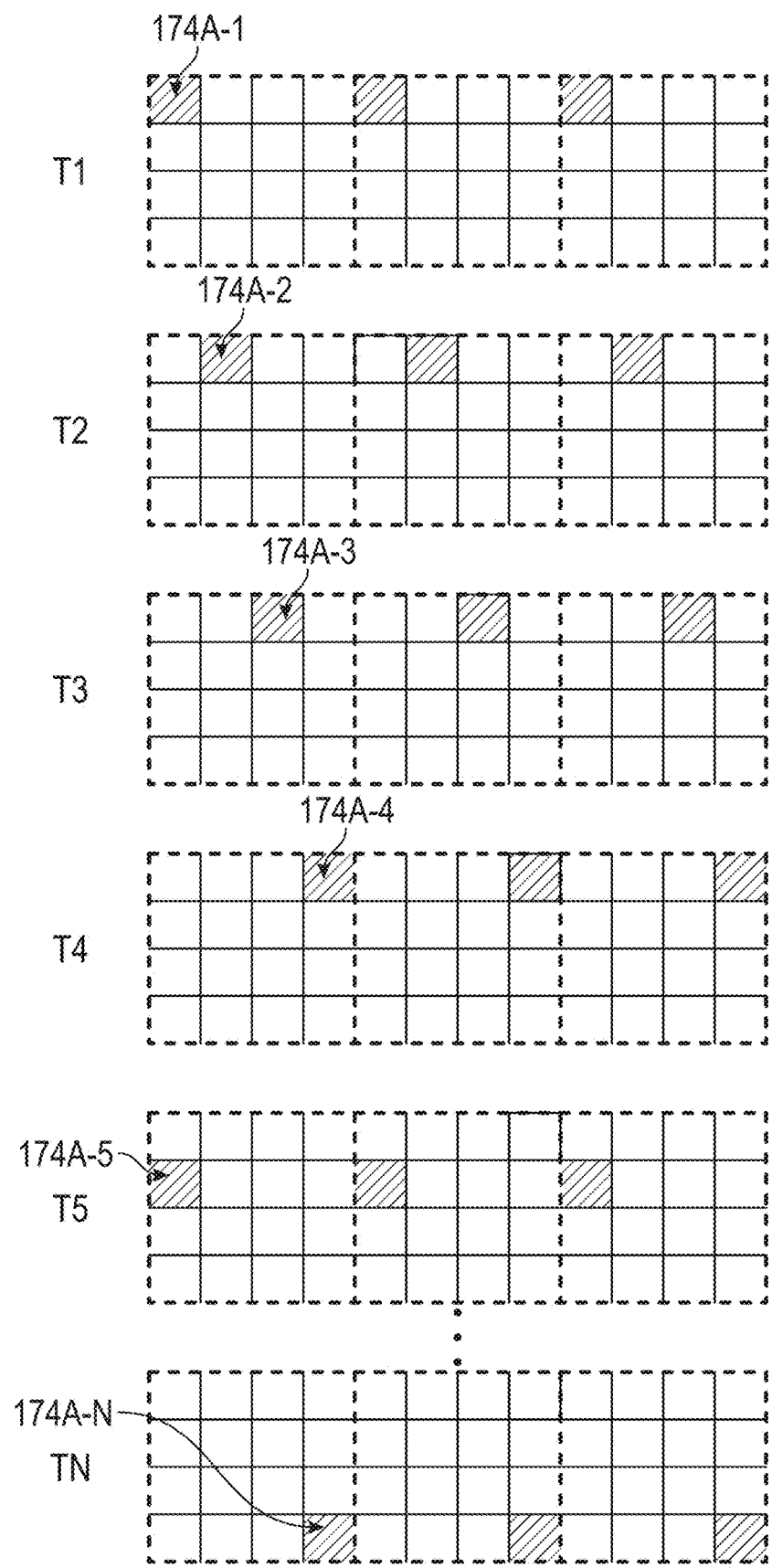
FIG. 9 illustrates a top view of a detector for multiple sub-frame exposures in an exemplary flash and scan process, according to embodiments of the disclosure.

FIG. 9 illustrates a top view of a detector for multiple sub-frame exposures in an exemplary flash and scan process, according to embodiments of the disclosure. Detector pixels arranged along a direction in the detector may be associated with different sets of detector pixels. For example, detector pixel 174A-1 may be in a first set captured during a first sub-frame exposure T1, detector pixel 174A-2 may be in a second set captured during a second sub-frame exposure T2, detector pixel 174A-3 may be in a third set captured during a third sub-frame exposure T3, detector pixel 174A-4 may be in a fourth set captured during a fourth sub-frame exposure T4. Between the first and fourth sub-frame exposures T1-T4, the electronically-controlled mirror 220 may move the transmitting light beams 110 in one direction (e.g., to the right).

For the next, fifth sub-frame exposure T5, the electronically-controlled mirror 220 may change its position in multiple directions (e.g., to the left and down) so that the fifth detector pixel 174A-5 may receive the first reflected light beam 112A. The electronically-controlled mirror 220 may continue changing its position for subsequent sub-frame exposures until some or all of the detector pixels in a group receive the reflected light beam 112, such as the Nth detector pixel 174A-N (where N is an integer) receiving the first reflected light beam 112A during the Nth sub-frame exposure TN. The electronically-controlled mirror 220 may then reset to the initial position (e.g., programmed for the first set) for the next frame exposure.

In some embodiments, the regions of the target 140 may be illuminated by transmitting light beams 110 in a corresponding manner as the reflected light beams 112 are incident on the detector pixels. FIG. 8 may be illustrative of the regions of the target 140 illuminated by the transmitting light beams 110.

The above disclosed ToF imaging system and methods for operation thereof may have a higher SNR, wider FOV, and lower power consumption due to the use of multiple, spatially separated transmitting light beams for imaging a target. In some embodiments, the ToF imaging system may have a higher frame rate due to illuminating multiple regions of the target during the same sub-frame exposure. The ToF imaging system may use an electronically-controlled mirror to perform one or more scan steps. The electronically-controlled mirror may scan different regions of the target at a high speed, increasing the frame rate. The electronically-controlled mirror may also reduce the weight, power, and size of the ToF imaging system. In some embodiments, the ToF imaging system may have a higher resolution due to illuminating sub-regions of the target and/or selectively perform multiple scans of certain target regions. The ToF imaging may also have a larger FOR due to use of scan steps and the image data processing apparatus stitching together information from multiple sub-frame exposures.

A time of flight (ToF) imaging system is disclosed. The ToF imaging system comprises: a light emission apparatus, the light emission apparatus comprising: a light source component including a light source, the light source component that generates a light beam when in operation, an optical splitter that splits the light beam generated by the light source component into multiple transmitting light beams and directs the multiple transmitting light beams to a target, and an electronically-controlled mirror that moves the multiple transmitting light beams; and a light receiving apparatus, the light receiving apparatus comprising: a detector that receives multiple reflected light beams from the target when in operation and generates one or more detector signals, wherein the multiple reflected light beams are a portion of the multiple transmitting light beams, and the one or more detector signals are representative of the multiple reflected light beams; and an image data processing apparatus that constructs target information based on the one or more detector signals from multiple sub-frame exposures. Additionally or alternatively, in some embodiments, the electronically-controlled mirror is a microelectromechanical (MEMS) mirror that changes positions for different sub-frame exposures. Additionally or alternatively, in some embodiments, the ToF imaging system further comprises optics that change one or more properties of the light beam or the multiple transmitting light beams, the one or more properties being one or more of a shape and a size. Additionally or alternatively, in some embodiments, during each of the multiple sub-frame exposures, the multiple transmitting light beams illuminate different regions of the target. Additionally or alternatively, in some embodiments, adjacent transmitting light beams of the multiple transmitting light beams are separated by a non-zero angle. Additionally or alternatively, in some embodiments, the detector includes multiple groups of detector pixels, each group receives a different reflected light beam of the multiple reflected light beams during a sub-frame exposure of the multiple sub-frame exposures. Additionally or alternatively, in some embodiments, each group includes multiple sets of detector pixels, wherein each set includes multiple detector pixels. Additionally or alternatively, in some embodiments, a spot size of at least one of the multiple transmitting light beams is larger than a size of a single detector pixel in the detector.

A method of operating a time of flight (ToF) imaging system is disclosed. The method comprises: capturing target information of a target during one of multiple sub-frame exposures, the multiple sub-frame exposures included in a frame exposure, wherein the capturing the target information comprises: performing a flash step or a scan step, wherein the flash step comprises generating a light beam, and the scan step comprises moving the light beam by changing a position of an electronically-controlled mirror of the ToF imaging system; splitting the light beam into multiple transmitting light beams; receiving multiple reflected light beams, the multiple reflected light beams being a return of the multiple transmitting light beams; generating one or more detector signals, the one or more detector signals representative of the multiple reflected light beams; repeating the capturing step until an end of the frame exposure; and stitching together the target information from the one or more detector signals from the multiple sub-frame exposures, wherein the frame exposure comprises at least one flash step and at least one scan step. Additionally or alternatively, in some embodiments, the flash step further comprises keeping the electronically-controlled mirror of the ToF imaging system stationary during the flash step. Additionally or alternatively, in some embodiments, the scan step further comprises maintaining an illumination of the light beam generated by the flash step. Additionally or alternatively, in some embodiments, the frame exposure comprises multiple scan steps, and the light beam is moved along multiple directions for the multiple scan steps. Additionally or alternatively, in some embodiments, generating the light beam comprises operating a light source with a pulse width, the pulse width greater than or equal to a duration of the frame exposure. Additionally or alternatively, in some embodiments, during each of the multiple sub-frame exposures, the multiple transmitting light beams illuminate different regions of the target. Additionally or alternatively, in some embodiments, the frame exposure comprises multiple flash steps.

A light emission apparatus is disclosed. The light emission apparatus comprises: a light source that outputs a light beam when in operation, wherein the light source generates the light beam during a flash step and maintains the light beam during a scan step; a controller electrically coupled to the light source, the controller generates one or more control signals to control the operation of the light source; and an optics component comprising: an optical splitter that splits the light beam into multiple transmitting light beams, and an electronically-controlled mirror that moves the multiple transmitting light beams in the scan step. Additionally or alternatively, in some embodiments, the electronically-controlled mirror is a MEMS mirror. Additionally or alternatively, in some embodiments, the optical splitter splits the light beam into at least three transmitting light beams. Additionally or alternatively, in some embodiments, the electronically-controlled mirror is capable of moving the multiple transmitting light beams in multiple directions. Additionally or alternatively, in some embodiments, the controller further controls the movement of the electronically-controlled mirror.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A time of flight (ToF) imaging system configured to obtain target information in a frame exposure which comprises multiple sub-frame exposures, the ToF imaging system comprising:
   a light emission apparatus configured to perform a flash step during a first sub-frame exposure of the multiple sub-frame exposures and a plurality of scan steps during any other sub-frame exposures of the multiple sub-frame exposures, the light emission apparatus comprising:
      a light source component including a light source, the light source component that generates a light beam during the flash step and maintains the light beam during the plurality of scan steps,
      an optical splitter that splits the light beam generated by the light source component into multiple transmitting light beams and directs the multiple transmitting light beams to a target during each sub-frame exposure, and
      an electronically-controlled mirror that moves the multiple transmitting light beams during the plurality of scan steps to illuminate different regions of the target for different sub-frame exposures; and
   a light receiving apparatus, the light receiving apparatus comprising:
      a detector that receives multiple reflected light beams from the target when in operation and generates one or more detector signals, wherein the multiple reflected light beams are a portion of the multiple transmitting light beams, and the one or more detector signals are representative of the multiple reflected light beams; and
      an image data processing apparatus that constructs target information based on the one or more detector signals from multiple sub-frame exposures.

2. The ToF imaging system of claim 1, wherein the electronically-controlled mirror is a microelectromechanical (MEMS) mirror that changes positions for different sub-frame exposures.

3. The ToF imaging system of claim 1, further comprising optics that change one or more properties of the light beam or the multiple transmitting light beams, the one or more properties being one or more of a shape and a size.

4. The ToF imaging system of claim 1, wherein during each of the multiple sub-frame exposures, the multiple transmitting light beams illuminate different regions of the target.

5. The ToF imaging system of claim 1, wherein adjacent transmitting light beams of the multiple transmitting light beams are separated by a non-zero angle.

6. The ToF imaging system of claim 1, wherein the detector includes multiple groups of detector pixels, each group receives a different reflected light beam of the multiple reflected light beams during a sub-frame exposure of the multiple sub-frame exposures.

7. The ToF imaging system of claim 6, wherein each group includes multiple sets of detector pixels, wherein each set includes multiple detector pixels.

8. The ToF imaging system of claim 1, wherein a spot size of at least one of the multiple transmitting light beams is larger than a size of a single detector pixel in the detector.

9. A method of operating a time of flight (ToF) imaging system, the method comprising:
   performing a capturing step to capture target information of a target in a frame exposure which comprises multiple sub-frame exposures, wherein the capturing step comprises:
      during a first sub-frame exposure of the multiple sub-frame exposures, performing a flash step, wherein the flash step comprises generating a light beam;
      during any other sub-frame exposure of the multiple sub-frame exposures, performing a scan step, wherein the scan step comprises moving the light beam by changing a position of an electronically-controlled mirror of the ToF imaging system;
      splitting the light beam into multiple transmitting light beams;
      receiving multiple reflected light beams, the multiple reflected light beams being a return of the multiple transmitting light beams; and
      generating one or more detector signals, the one or more detector signals representative of the multiple reflected light beams;
   repeating the capturing step until an end of the frame exposure; and
   stitching together the target information from the one or more detector signals from the multiple sub-frame exposures,
   wherein the frame exposure comprises at least one flash step and at least one scan step.

10. The method of claim 9, wherein the flash step further comprises keeping the electronically-controlled mirror of the ToF imaging system stationary during the flash step.

11. The method of claim 9, wherein the scan step further comprises maintaining an illumination of the light beam generated by the flash step.

12. The method of claim 9, wherein the frame exposure comprises multiple scan steps, and the light beam is moved along multiple directions for the multiple scan steps.

13. The method of claim 9, wherein generating the light beam comprises operating a light source with a pulse width, the pulse width greater than or equal to a duration of the frame exposure.

14. The method of claim 9, wherein during each of the multiple sub-frame exposures, the multiple transmitting light beams illuminate different regions of the target.

15. The method of claim 9, wherein the frame exposure comprises multiple flash steps.

* * * * *